United States Patent
Kato et al.

[11] Patent Number: 5,991,211
[45] Date of Patent: Nov. 23, 1999

[54] SEMICONDUCTOR MEMORY DEVICE WITH REDUNDANCY CONTROL CIRCUITS

[75] Inventors: Daisuke Kato; Yohji Watanabe, both of Yokohama, Japan

[73] Assignee: Kabushiki Kaisha Toshiba, Kawasaki, Japan

[21] Appl. No.: 09/181,977

[22] Filed: Oct. 29, 1998

[30] Foreign Application Priority Data

Oct. 31, 1997 [JP] Japan .................................... 9-316080

[51] Int. Cl.$^6$ ...................................................... G11C 7/00
[52] U.S. Cl. ......................................... 365/200; 365/225.7
[58] Field of Search ................................ 365/200, 225.7, 365/230.08, 230.03, 230.06

[56] References Cited

U.S. PATENT DOCUMENTS 5,798,974 8/1998 Yamagata .............................. 365/200

Primary Examiner—Huan Hoang
Assistant Examiner—David Lam
Attorney, Agent, or Firm—Loeb & Loeb, LLP

[57] ABSTRACT

A semiconductor memory device has sets of address fuses which are arranged in a plurality of fuse rows in order to provide a larger number of redundant elements. The sets of address fuses are associated with addresses, respectively, and at least one address fuse included in each of the sets of the address fuses is provided in only one of the fuse rows. Address buses are provided such that the number of address lines associated with the sets of the address fuses is less than the number of fuse rows. One of the address lines is located closer to one of the fuse rows which includes associated address fuses than a center line between the one of the fuse rows and another one of the fuse rows which is adjacent to the one of the fuse rows is. The address lines are connected to redundant element control circuits through local lines.

20 Claims, 8 Drawing Sheets

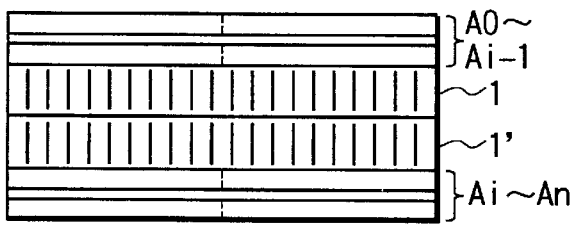
FIG. 7A
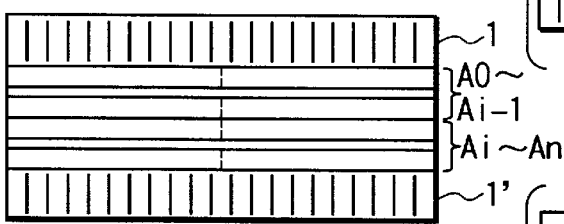
FIG. 7B
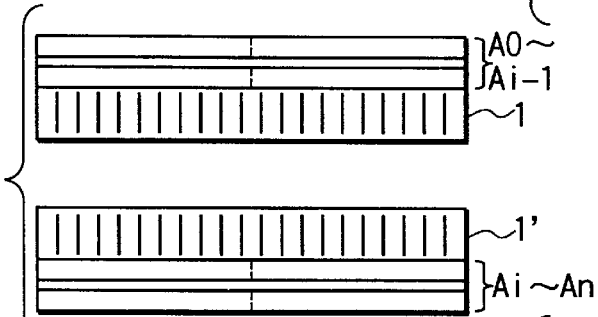
FIG. 7C
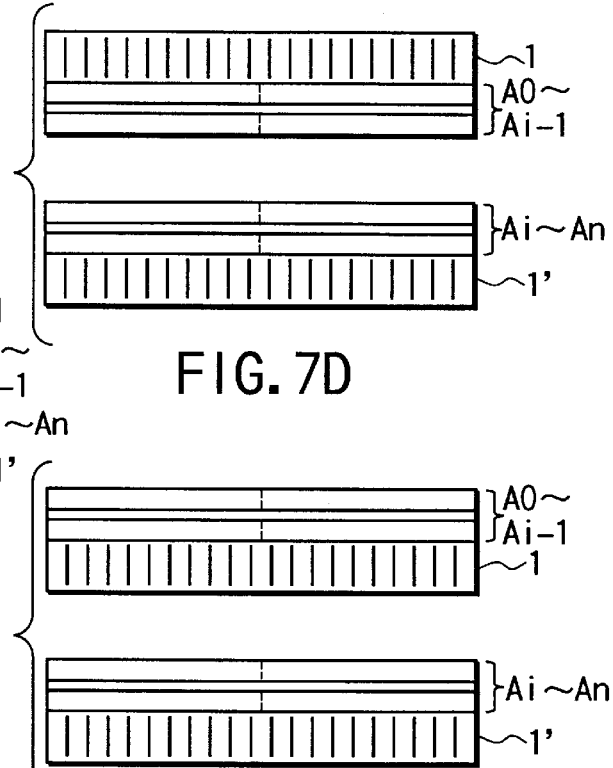
FIG. 7D
FIG. 7E
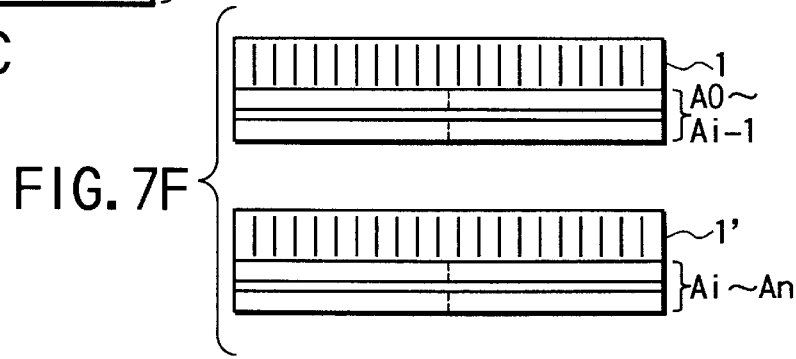
FIG. 7F

SEMICONDUCTOR MEMORY DEVICE WITH REDUNDANCY CONTROL CIRCUITS

BACKGROUND OF THE INVENTION

The present invention relates to a semiconductor memory device, and in particular, an improvement of a redundancy technique for a DRAM in which address fuses are arranged in a form of a plurality of stages of row.

In the technical field of a semiconductor device, elements to be incorporated into a semiconductor chip have been formed to have a smaller size, thus increasing the number of elements incorporated into one semiconductor chip. This has been accompanied by an increase in the number of defects in the elements. Furthermore, due to dusts or impurities fallen onto a portion of the memory cell array of the semiconductor chip, a large size of defect has occurred in the elements on the memory cell array portion. These element or elements are referred to as defective element or elements hereinafter.

However, the yield was low just after such smaller semiconductor elements had been developed or at the beginning of their mass production. To solve this problem, a technique for providing a redundant element control circuit has been proposed, and put to practical use (hereinafter this technique will be referred to a redundancy technique). In the redundancy technique, redundant elements are prepared on the supposition that the semiconductor device has defective elements. To be more specific, if a defective element is detected in a manufactured memory cell array, a redundant element is used instead of the defective element. That is, when an input address signal for designating the defective element is inputted, a redundant element is selected instead of the defective element.

Such a technique is the above-mentioned redundancy technique. By virtue of the redundancy technique, even if a semiconductor device includes a defective element, it can be used as a non-defective semiconductor device by employing a redundant element instead of the defective element.

The defective elements may cause in a row (word line). The defective elements may cause in a column (bit line pair). The defective elements may cause in a plurality of rows (word lines). The defective elements may cause in a plurality of columns (bit line pairs). Accordingly, the redundant element or elements mean element or elements contained in a row (word line), element or elements contained in a column (bit line pair), element or elements contained in a plurality of rows (word lines), or element or elements contained in a plurality of columns (bit line pairs). That is, the redundant element or elements mean element or elements contained in a row (word line) as a unit, element or elements contained in a column (bit line pair) as a unit, element or elements contained in a plurality of rows (word lines) as a unit, or element or elements contained in a plurality of columns (bit line pairs) as a unit.

The size of the semiconductor chip is slightly increased when the redundancy technology is incorporated thereinto. However, the yield is greatly improved, since as explained above, a semiconductor device is employed as a non-defective device even if it includes a defective element.

FIG. 9 illustrates a redundant element control circuit. A plurality of the redundant element control circuits are provided for the respective redundant elements. Addresses are programmed to each of redundant element control circuit to designate a corresponding redundant element. Thus, when an input address signal is inputted to the redundant element control circuits, a corresponding redundant element control circuit is selected and activated in response to the input address signal to select the corresponding redundant element.

The redundant element control circuit 6 comprises a fuse latch circuit group 4 and a comparator 5 which will be explained later with reference to FIG. 12. The fuse latch circuit group 4 includes a plurality of fuse latch circuits, which are required to select an associated redundant element. Each of the fuse latch circuits is illustrated in FIG. 10, and thus will be explained with reference thereto as follows:

The fuse latch circuit, as shown in FIG. 10, comprises a PMOS transistor Tr1, an NMOS transistor Tr2, an inverter INV1, an inverter INV2, a transmission gate Tr3, a transmission gate Tr4, and an address fuse 3. The transmission gate Tr3 is constituted by a parallel circuit comprising a PMOS transistor and an NMOS transistor. Also, the transmission gate Tr4 is constituted by a parallel circuit comprising a PMOS transistor and an NMOS transistor.

An initializing signal X is inputted to the gate of the PMOS transistor Tr1, and an initializing signal Y is inputted to the gate of the NMOS transistor Tr2. The source of the PMOS transistor Tr1 is connected to power supply potential, and the drain of the PMOS transistor Tr1 is connected to the drain of the NMOS transistor Tr2. The source of the NMOS transistor Tr2 is connected to an address fuse FAi, and then connected to ground potential by the address fuse FAi. An input terminal of the inverter INV1 is connected to a common drain node of the transistors Tr1 and Tr2. Also, an output terminal of the inverter INV2 is connected to the common drain node of the transistors Tr1 and Tr2. An output terminal of the inverter INV1 is connected to an input terminal of the inverter INV2.

The gate of the PMOS transistor of the transmission gate Tr3 and the gate of the NMOS transistor of the transmission gate Tr4 are also connected to the common drain node of the transistors Tr1 and Tr2. The gate of the NMOS transistor of the transmission gate Tr3 is connected to the output terminal of the inverter INV1. To be more specific, the gate of the PMOS transistor of the transmission gate Tr3 and the gate of the NMOS transistor of the transmission gate Tr4 are connected to the common drain node of the transistors Tr1 and Tr2, and the gate of the NMOS transistor of the transmission gate Tr3 and the gate of the PMOS transistor of the transmission gate Tr4 are connected to the output terminal of the inverter INV1.

An address ADD<i> is inputted to the transmission gate Tr3 from an address line of an address bus through a local line, and an address /ADD<i> is inputted to the transmission gate Tr4 from another address line of the address bus through another local line. The character "/" represents a logical inversion signal (complementary signal). Address ADD<i> is outputted from the transmission gate Tr3 as an output FOUT<i>, or address /ADD<i> is outputted from the transmission gate Tr4 as an output FOUT<i>.

In the fuse latch circuit 4, when power is supplied, the initializing signals X and Y, which are illustrated in FIG. 11, are inputted to the gate of the PMOS transistor Tr1 and the gate of the NMOS transistor Tr2, respectively, and the fuse latch circuit 4 is thus initialized. When the input address signal is changed, ADD<i> is outputted from the transmission gate Tr3 or /ADD<i> is outputted from the transmission gate Tr4, as the output FOUT<i> of the fuse latch circuit 4. Whether ADD<i> is outputted or /ADD<i> is outputted depends on whether or not the fuse FAi is cut.

The comparator 5, as shown in FIG. 12, comprises a NAND circuit on its input side and a NOT circuit on its output side. The NOT circuit is series-connected to the NAND circuit. When the number of addresses required to select a redundant element is n+1, the NAND circuit receives FOUT<0> to FOUT<n>. When all FOUT<0> to FOUT<n> are at 1 level, the comparator 5 generates a redundant element enabling signal ENABLE, to thereby activate an associated redundant element. When the associated redundant element is activated, a memory element connected thereto is activated.

As explained above, the redundant element control circuits each having a fuse latch circuit group 4 and a comparator 5 are provided for the respective redundant elements. The fuse latch circuit group 4 comprises a plurality of fuse latch circuits, which are required to select an associated redundant element. Each of the fuse latch circuits includes an address fuse FA (FIG. 8), which is associated with an address to be programmed thereto. Therefore, if the number of redundant elements is increased, the total number of address fuses is also increased, and thus the address fuses cannot be arranged in one row. Therefore, in the conventional semiconductor memory device, the address fuses are arranged in a form of a plurality of fuse rows (stages), e.g., two fuse rows 1 and 1' (two stages) as shown in FIG. 8. Address lines of an address bus are provided in a region between adjacent two of the fuse rows, e.g., in a region between the fuse rows 1 and 1' as shown in FIG. 8.

In the conventional semiconductor memory device, when the address fuses are arranged in a form of a plurality of fuse rows (stages), e.g., two fuse rows, a plurality of sets of the address fuses, which are respectively associated with the redundant elements, are divided into two groups (two rows), and each of the address fuse sets is provided in any one of two rows, as shown in FIG. 13. The address fuses of each address fuse set are associated with addresses for designating a corresponding redundant element. In the example of FIG. 13, a fuse set 2 (including fuses FA0, FA1, FA2 . . . FAn) associated with a redundant element is provided in a fuse row 1 (the first stage), and a fuse set 2' (including fuses FA0, FA1, FA2 . . . FAn) associated with another redundant element is provided in a fuse row 1' (the second stage). That is, a plurality of address fuses associated with the same address are arranged in both of the two fuse rows 1 and 1'.

In the conventional semiconductor memory device, two address lines are provided for the fuse rows 1 and 1', respectively, as shown in FIG. 14, in the case where it is difficult to provide a layout of local lines from an address line to the fuse latch circuits, e.g. 4n, of the redundant element control circuits. In other words, the memory device needs two address lines one of which is for the fuse row 1 and the other is for fuse row 1' (in the case where the input address signal is a complementary address signal, four address lines are needed two of which are for the fuse row 1 and the other two are for fuse row 1'). Address lines A0, A1, A2 . . . An (six address lines in the example shown in FIG. 14) are provided for the fuse row 1, and address lines A0, A1, A2 . . . An (six address lines in the example of FIG. 14) are provided for the fuse row 1'. Accordingly, in the example of FIG. 14, the two address lines are provided to each of the addresses, as a result of which the region occupied by the address lines is great, thus increasing the address line area on the semiconductor chip. Furthermore, the consumption of current for driving the address lines is large since the number of address lines is large. In addition, the capacitance of the address lines is increased, and thus the address transition speed is lowered, and as a result the speed of selection of a redundant element is also lowered, as long as the sizes of address drivers provided for driving the address lines are not increased.

Moreover, there is a case where as shown in FIG. 15, it is possible to provide a layout of the local lines from one address line to the fuse latch circuits of the redundant element control circuits, whose address fuses are arranged in the form of two rows 1 and 1'. In this case, the address lines A0, A1, A2 . . . An (six address lines in the example shown in FIG. 15) are provided between the two fuse rows 1 and 1', as common address lines. To be more specific, the common address lines are used commonly for both the fuse rows 1 and 1', and thus connected commonly, by the local lines, to the fuse latch circuits 4i of the redundant element control circuits on the sides of the fuse rows 1 and 1'. However, the local lines must be extended from the common address lines toward the fuses 1 and 1', respectively. They must have great lengths. As a result, the parasitic capacitance of the local lines connected to the address lines is increased, and thus the consumption of current for driving the address lines is also increased. Consequently, the transition speed of the input address signal is lowered, and that of selection of a redundant element is also lowered, as long as the sizes of the address drivers are not increased.

BRIEF SUMMARY OF THE INVENTION

The present invention has been made in consideration of the above circumstances, and its object is to provide a semiconductor memory device in which the area of the semiconductor chip is small, the consumption of electric current is small, the transit speed of the address line is high, and a redundant element is selected at a high speed.

According to the present invention, in the semiconductor memory device in which address fuses arranged in a plurality of fuse rows in order to provide a larger number of redundant elements, in one of plurality of address fuse groups each include those of the address fuses, which are associated with the same address, a portion or all of the those address fuses associated with the same address are arranged on one of two of the plurality of fuse address fuse rows, which two address fuse rows are adjacent to each other and forms an address fuse row set. In such a manner, at least one of the plurality of address lines has only to be provided for only one of the two address fuse rows. Thus, the area necessary for provision of the address lines is small, and the capacitance of the address lines is also small. Furthermore, the local lines are extended in one way so that the total wiring length of the local lines are shortened, thus decreasing the parasitic capacitance of the local lines.

In the semiconductor memory device according to the present invention, one of the address lines which is associated with the at least one address group may be provided in one side of the address bus which is closer to one of the two fuse rows which includes those of the address fuses which are associated with the one address line than the other side of the address bus. That is, if the address bus comprises (N+1) address lines, the at least one address line may be included in (n+1)/2 of the (N+1) address lines which are closer to the address fuse row including the address fuses associated with the at least one address line than the other (n+1)/2 of the (N+1) address lines.

According to a first aspect of the present invention, there is provided a semiconductor memory device comprising: a memory cell array comprising a plurality of memory cells; a row decoder for selecting at least one of word lines on the basis of an input address signal; a column decoder for selecting at least one of bit lines on the basis of an input address signal; a plurality of redundant elements each provided to be used instead of a defective element connected to the at least one of the word lines or the at least one of bit lines; address fuses arranged in a plurality of fuse rows, the address fuses being programmed to have information for replacing the defective element by the redundant element; and an address bus comprising a plurality of address lines for transferring the input address signal; wherein, in one of plurality of address fuse groups each include those of the address fuses, which are associated with the same address, a portion or all of the those address fuses associated with the same address are arranged on one of two of the plurality of fuse address fuse rows, which two address fuse rows are adjacent to each other and forms an address fuse row set.

In the semiconductor memory device according to the first aspect of the present invention, one of the address lines which is associated with the at least one address group may be provided in one side of the address bus which is closer to one of the two fuse rows which includes those of the address fuses which are associated with the one address line than the other side of the address bus. The one of the fuse rows may include those of the address fuses which are associated with row redundant elements and those of the address fuses which are associated with column redundant elements. At least two of the those of the address fuses which are associated with those of the row redundant elements which are associated with the same address may be arranged adjacent to each other, and at least two of the those of the address fuses which are associated with those of the column redundant elements which are associated with the same address may be arranged adjacent to each other. The address fuses including the those address associated with the those row redundant elements and the those address associated with the those column redundant elements may be located close to the column decoder, and the two adjacent address fuses associated with the redundancy column lines may be located closer to the gap provided between two of the address fuses than the two adjacent address fuses associated with the redundancy row lines are. The address fuses including the those address associated with the those row redundant elements and the those address associated with the those column redundant elements may be located close to the row decoder, and the two adjacent address fuses associated with the redundancy row lines may be located closer to the gap provided between two of the address fuses than the two adjacent address fuses associated with the redundancy column lines are.

In the semiconductor memory device according to the first aspect of the present invention, the number of those of the address lines of the address bus, which are associated with the at least one address fuse group may be less than the number of the fuse rows. One of the address lines which is associated with the at least one address group may provided in one side of the address bus which is closer to one of the two fuse rows which includes those of the address fuses which are associated with the one address line than the other side of the address bus. The one of the fuse rows may include those of the address fuses which are associated with row redundant elements and those of the address fuses which are associated with column redundant elements.

In the semiconductor memory device according to the first aspect of the present invention, at least two address fuses of the at least one address fuse group may be arranged adjacent to each other. The one of the fuse rows may include those of the address fuses which are associated with row redundant elements and those of the address fuses which are associated with column redundant elements.

In the semiconductor memory device according to the first aspect of the present invention, at least one of the address fuse rows may be located close to one of the row decoder and the column decoder, and a gap for extending therethrough the address lines may be provided between predetermined two of the address fuses arranged in the at least one of the address fuse rows. One of the address lines which is associated with the at least one address fuse group may be located between the at least one of the address fuse rows and one of the address fuse rows which is adjacent to the at least one of the address fuse rows, and the one address line may be used in common for the row decoder, the column decoder and a data line sense amplifier. The one of the fuse rows may include those of the address fuses which are associated with row redundant elements and those of the address fuses which are associated with column redundant elements.

In the semiconductor memory device according to the first aspect of the present invention, the one of the fuse rows may include those of the address fuses which are associated with row redundant elements and those of the address fuses which are associated with column redundant elements. At least two of the those of the address fuses which are associated with those of the row redundant elements which are associated with the same address may be arranged adjacent to each other, and at least two of the those of the address fuses which are associated with those of the column redundant elements which are associated with the same address may be arranged adjacent to each other. The address fuses including the those address associated with the those row redundant elements and the those address associated with the those column redundant elements may be located close to the column decoder, and the two adjacent address fuses associated with the redundancy column lines may be located closer to the gap provided between two of the address fuses than the two adjacent address fuses associated with the redundancy row lines are. The address fuses including the those address associated with the those row redundant elements and the those address associated with the those column redundant elements may be located close to the row decoder, and the two adjacent address fuses associated with the redundancy row lines may be located closer to the gap provided between two of the address fuses than the two adjacent address fuses associated with the redundancy column lines are.

According to a second aspect of the present invention, there is provided a semiconductor memory device comprising: a memory cell array comprising a plurality of memory cells; a row decoder for selecting at least one of word lines on the basis of an input address signal; a column decoder for selecting at least one of bit lines on the basis of an input address signal; a plurality of redundant elements each provided to be used instead of a defective element connected to the at least one of the word lines or the at least one of bit lines; address fuses arranged in two fuse rows, the address fuses being programmed to have information for replacing the defective element by the redundant element, the address fuses being grouped into a plurality of address fuse groups each includes those of the address fuses which are associated with the same address; and an address bus comprising a plurality of address lines for transferring the input address signal; wherein a portion or all of the address fuses of at least one of the plurality of address fuse groups is provided on one of the two address fuse rows.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7A is a schematic view of a pattern of arrangement of the address fuses and the address lines in the semiconductor memory device of the present invention.

FIG. 7B is a schematic view of another pattern of arrangement of the address fuses and the address lines in the semiconductor memory device of the present invention.

FIG. 7C is a schematic view of a further pattern of arrangement of the address fuses and the address lines in the semiconductor memory device of the present invention.

FIG. 7D is a schematic view of yet another pattern of arrangement of the address fuses and the address lines in the semiconductor memory device of the present invention.

FIG. 7E is a schematic view of a still further pattern of arrangement of the address fuses and the address lines in the semiconductor memory device of the present invention.

FIG. 7F is a schematic view of an additional pattern of arrangement of the address fuses and the address lines in the semiconductor memory device of the present invention.

DETAILED DESCRIPTION OF THE INVENTION

The embodiments of the present invention will be explained with reference to the accompanying drawings.

Figure 1:
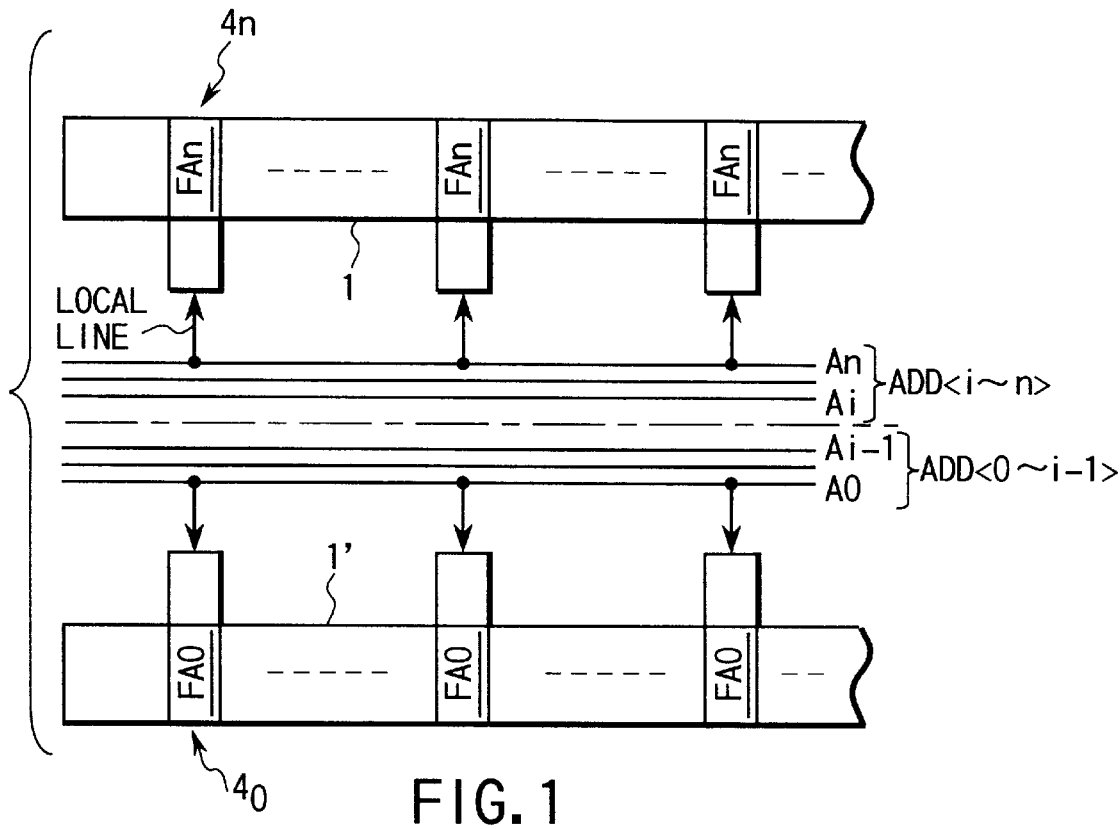
FIG. 1 is a view of a pattern of arrangement of fuse rows and address lines in a semiconductor memory device according to a first embodiment of the present invention.

First of all, a first embodiment of the present invention will be discussed with reference to FIG. 1 as follows:

FIG. 1 is a view of a pattern of arrangement of fuse rows 1 and 1' and address lines in the semiconductor memory device, e.g., a DRAM, according to the first embodiment, which comprises the address lines constituting an address lines and being connected to fuse latch circuits $4_0$ to $4n$ by local lines. However, in FIG. 1, only two fuse latch circuits $4_0$ and $4n$ are shown, for simplicity.

Figure 9:
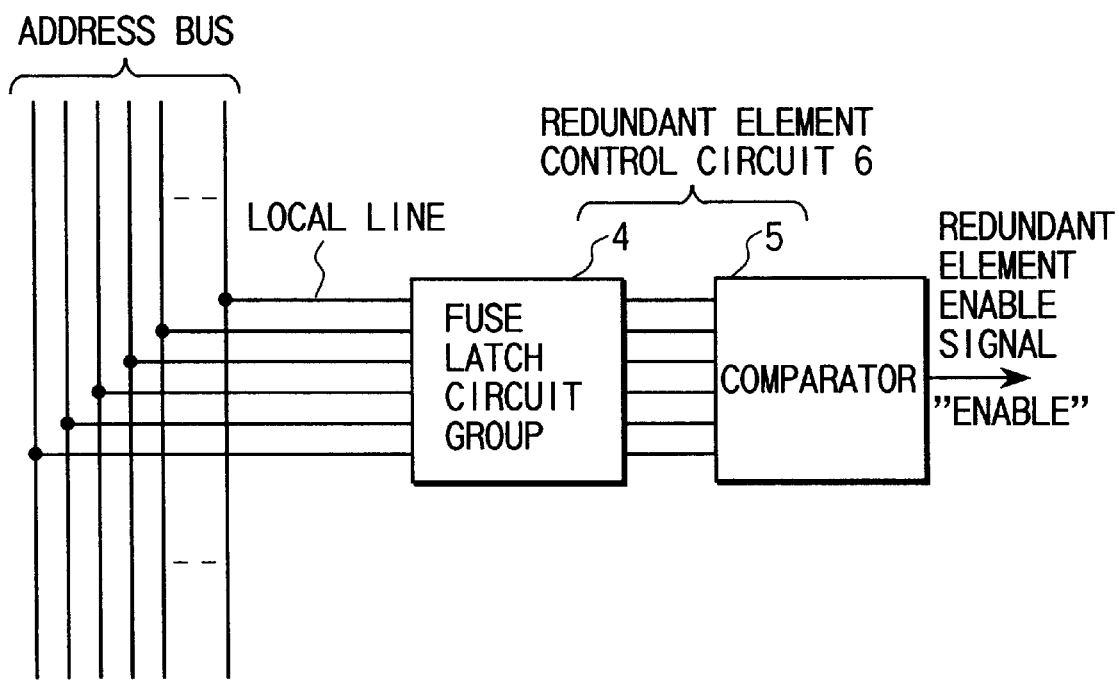
FIG. 9 is a view of a pattern of arrangement of a redundant element control circuit, address lines and local lines in the conventional semiconductor memory device.
Figure 10:
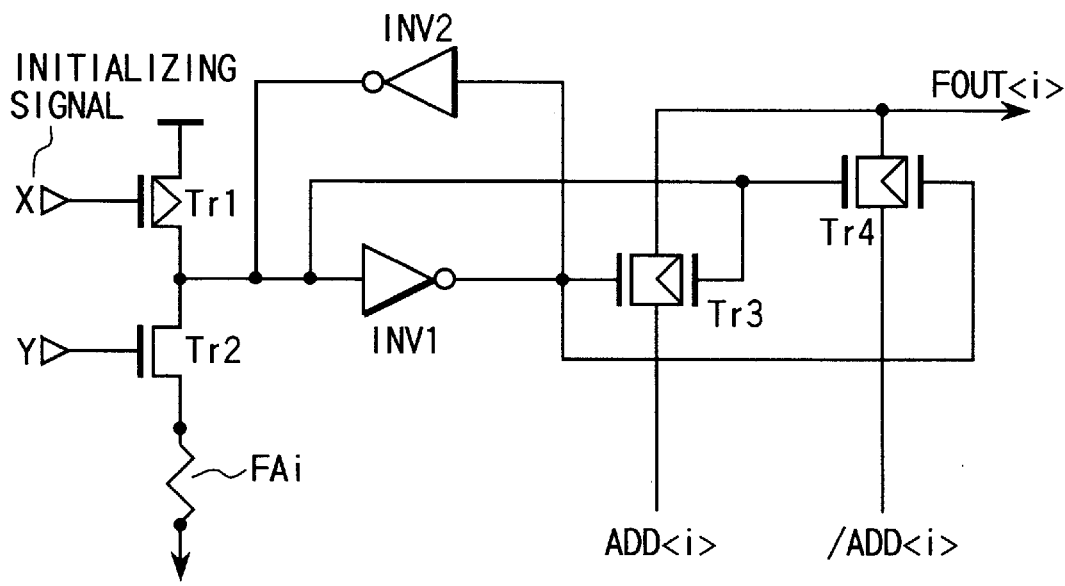
FIG. 10 is a block diagram of each of fuse latch circuits of each redundant element control circuit in the conventional semiconductor memory device.
Figure 11:
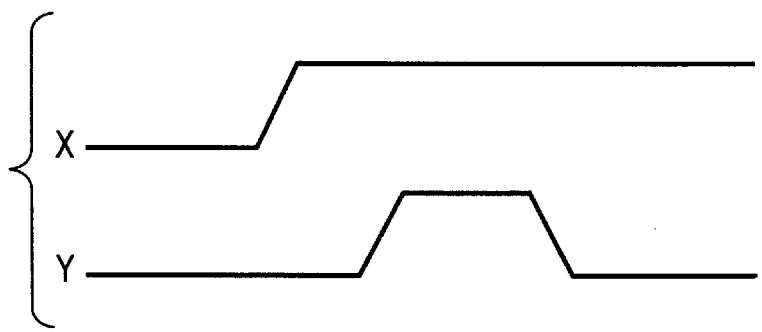
FIG. 11 is a view for showing wave forms of initializing signals inputted to the fuse latch circuit shown in FIG. 10.
Figure 12:
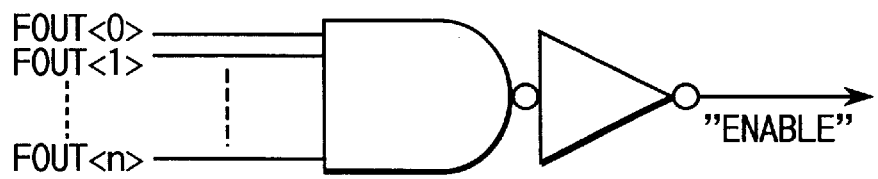
FIG. 12 is a block diagram of a comparator of each redundant element control circuit in the conventional semiconductor memory device.
Figure 13:
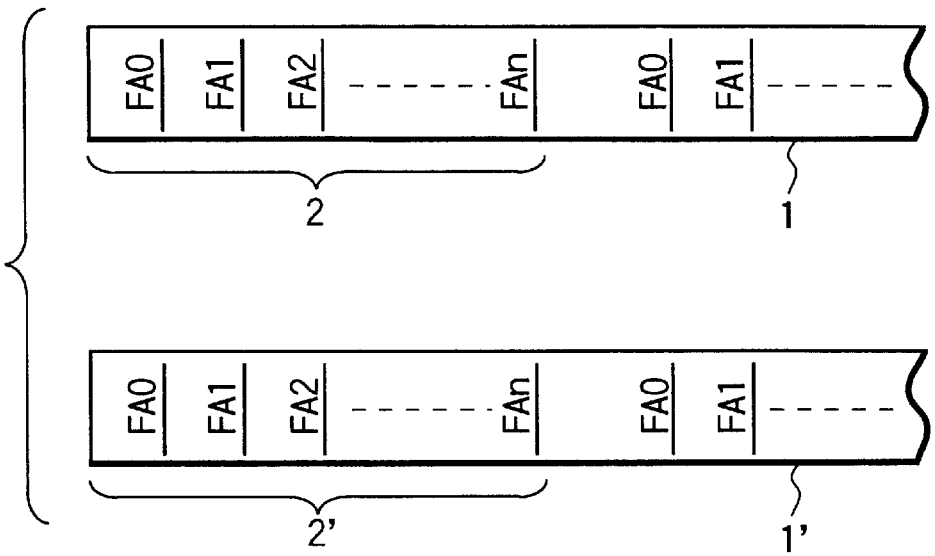
FIG. 13 is a view of a pattern of arrangement of fuse rows in the conventional semiconductor memory device.
Figure 14:
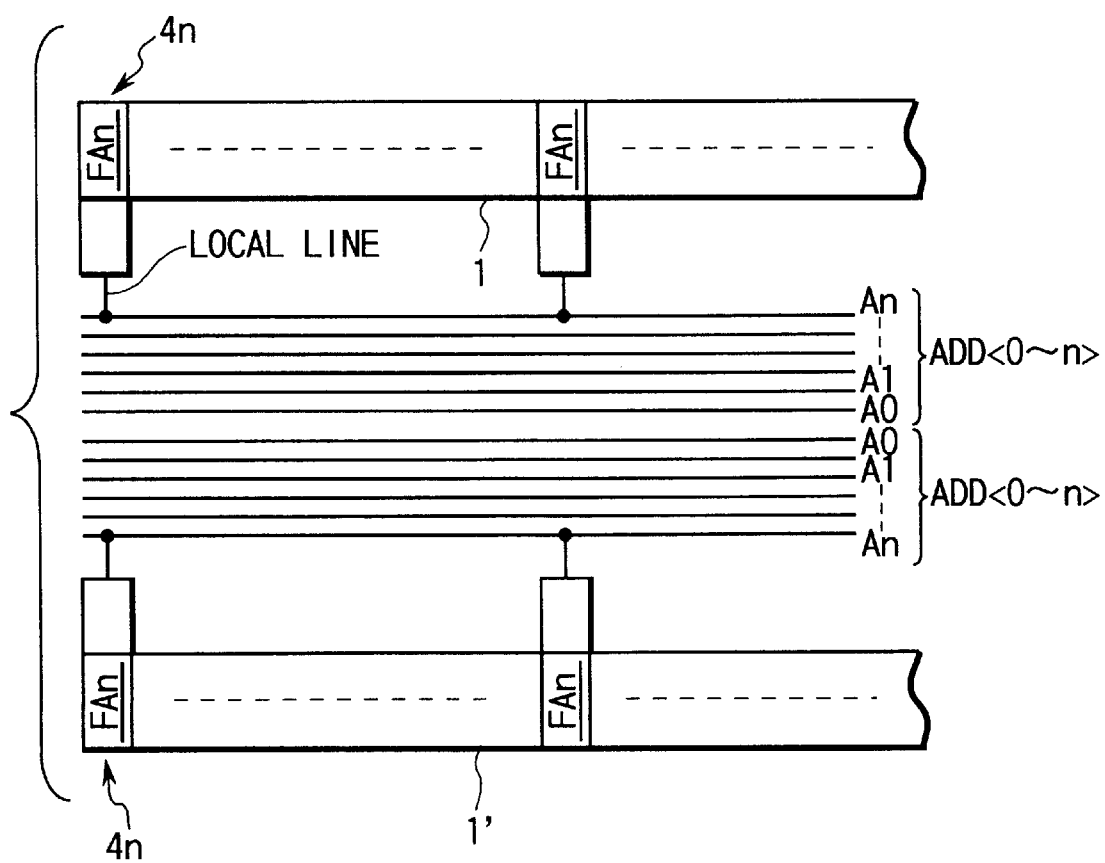
FIG. 14 is a view of a pattern of arrangement of fuse rows and address lines in the conventional semiconductor memory device.
Figure 15:
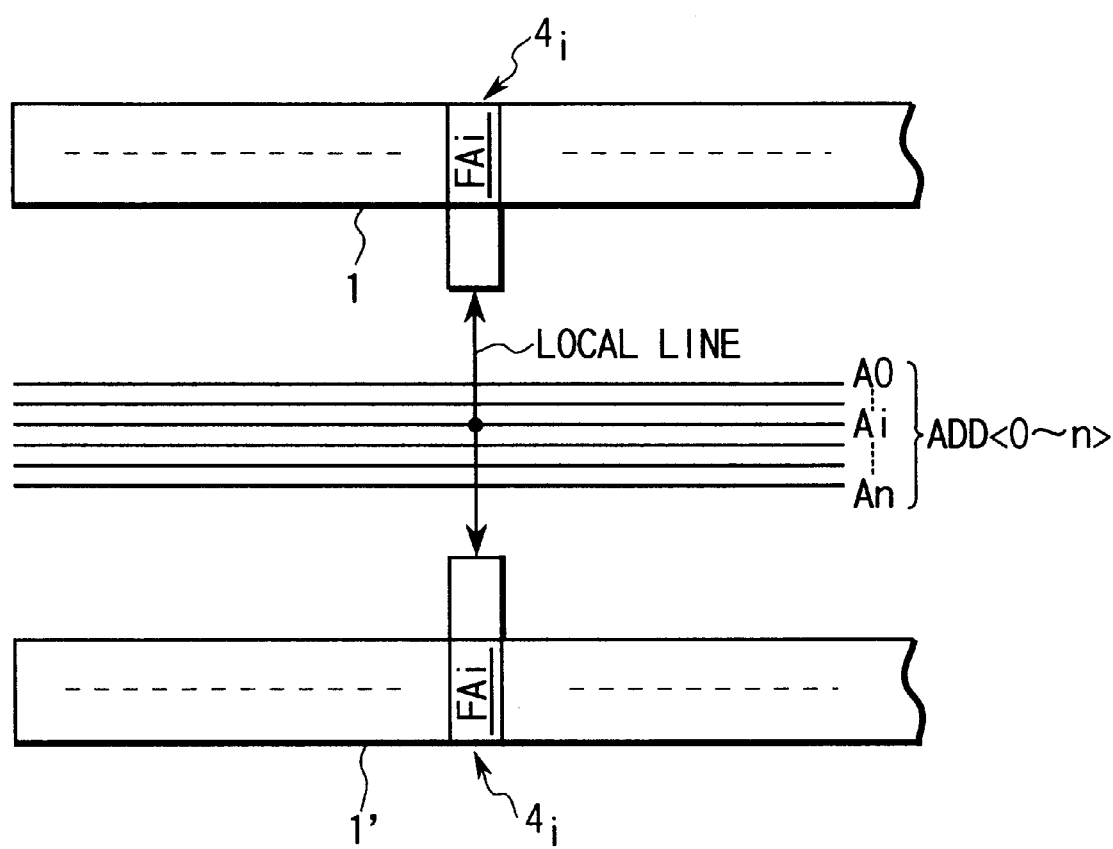
FIG. 15 is a view of a pattern of arrangement of local lines and address lines in the conventional semiconductor memory device.

According to the first embodiment, each of the redundant element control circuits comprises a comparator 5 and a fuse latch circuit group 4, as in the conventional semiconductor memory device shown in FIG. 9. The fuse latch circuit group 4 is the same as that in the conventional semiconductor memory device, and comprises a plurality of fuse latch circuits $4_0$ to $4n$, each including an address fuse. The address fuses are arranged in a form of two rows in this embodiment, as shown in FIG. 1. However, they may be arranged in more than two rows. Address lines A0 to An includes three address lines A0 to Ai-1 and three address lines Ai to An. The total number of the address lines A0 to An is six. However, it may be more than six or less than six. Addresses ADD<0 to i-1> are inputted to the address lines A0 to Ai-1, respectively, and addresses ADD<i to n> are inputted to the address lines Ai to An, respectively. That is, if the address bus comprises (N+1) address lines, said at least one address line is included in (n+1)/2 of the (N+1) address lines which are closer to the address fuse row including the address fuses associated with said at least one address line than the other (n+1)/2 of the (N+1) address lines.

Each of local lines is formed of a first wiring layer on a semiconductor chip, e.g., an aluminum wiring layer, and each of the address lines is formed of a second wiring layer on the semiconductor chip, e.g., an aluminum wiring layer. The address lines are connected, by the local lines, to the fuse latch circuits of the fuse latch circuit group 4 (FIG. 9). The address fuse contained in each of the fuse latch circuits is provided in any of the fuse row 1 (the first stage) and the fuse row 1' (the second stage). The other members of each fuse latch circuit are also located close to any of the fuse rows 1 and 1'. The drawings schematically illustrate the fuse rows 1 and 1' in order to explain the arrangement of the address fuses.

In this embodiment, the address fuses are arranged in a form of two fuse rows 1 and 1'. In at least one address fuse group, e.g. FAn, of the plurality of address fuse groups each include those of the address fuses, which are associated with the same address, a portion or all of said those address fuses associated with the same address are arranged on one row 1 of two fuse rows 1 and 1'. Similarly, in at least one address fuse group, e.g. FA0, of the plurality of address fuse groups each include those of the address fuses, which are associated with the same address, a portion or all of said those address fuses associated with the same address are arranged on one row 1' of two fuse rows 1 and 1'. Thus, at least one of the plurality of address lines has only to be provided for only one of the two address fuse rows. Thus, the area necessary for provision of the address lines is small, and the capacitance of the address lines is also small. Furthermore, the local lines are extended in one way so that the total wiring length of the local lines are shortened, thus decreasing the parasitic capacitance of the local lines.

In this embodiment, one address line, e.g., An, of the address lines An to A0, which is associated with said at least one address group is provided in one side of the address bus which is closer to one fuse row 1 of the two fuse rows 1 and 1' which includes those FAn of the address fuses which are associated with said one address line An than the other side of the address bus. Similarly, one address line, e.g. A0, of the address lines An to A0, which is associated with said at least one address group is provided in one side of the address bus which is closer to one fuse row 1' of the two fuse rows 1 and 1' which includes those FA0 of the address fuses which are associated with said one address line A0 than the other side of the address bus. That is, if the address bus comprises (N+1) address lines, said at least one address line is included in (n+1)/2 of the (N+1) address lines which are closer to the address fuse row including the address fuses associated with said at least one address line than the other (n+1)/2 of the (N+1) address lines.

That is, in FIG. 1, a plurality of address fuses FAn of a plurality of fuse sets, associated with address ADD<n>, are arranged in the fuse row 1, and a plurality of address fuses FA0 of the plurality of fuse sets, associated with address ADD<0>, are arranged in the fuse row 1'.

Moreover, the fuse row 1' does not include at least address fuses FAn of the fuse latch circuit 4n associated with the address ADD<n>. Accordingly, the local lines associated with the address fuses FAn are extended from the associated address line An only toward the fuse row 1. Similarly, the fuse row 1 does not include at least address fuses A0 associated with the address ADD<0>. Accordingly, the local lines associated with the address fuses FA0 of the fuse latch circuit $4_0$ are extended from the associated address line A0 only toward the fuse row 1'. In this way, the local lines are extended toward one of the two fuse rows 1 and 1'.

In this way, according to the present invention, in the semiconductor memory device in which address fuses arranged in a plurality of fuse rows in order to provide a larger number of redundant elements, in one of plurality of address fuse groups each include those of the address fuses, which are associated with the same address, a portion or all of said those address fuses associated with the same address are arranged on one of two of the plurality of fuse address fuse rows, which two address fuse rows are adjacent to each other and forms an address fuse row set. In such a manner, at least one of the plurality of address lines has only to be provided for only one of the two address fuse rows. Thus, the area necessary for provision of the address lines is small, and the capacitance of the address lines is also small. Moreover, the power consumption required for driving the address lines becomes small, and the speed at which an address signal transits becomes high, thus increasing the speed of selection of a redundant element. Such advantageous effects become more remarkable as the number of addresses increases in the semiconductor memory device of above structure in which a portion or all of said those address fuses associated with the same address are arranged on one of two of the plurality of fuse address fuse rows, which two address fuse rows are adjacent to each other and forms an address fuse row set. Moreover, the local lines are extended toward one of the two fuse rows 1 and 1', and thus the length of the local lines can be shortened. Accordingly, the parasitic capacitance of the local lines is also small. Furthermore, the address lines having a wiring capacitance (including a gate capacitance) are arranged close to the fuse latch circuits, and thus the length of the local lines can further be shortened. As a result, the variance in capacitance of the address lines is small, and thus address drivers having the same size (the same driving power) can be used, and the address skew can be reduced.

A modification of the semiconductor memory device according to the first embodiment will be explained with reference to FIG. 2.

Figure 2:
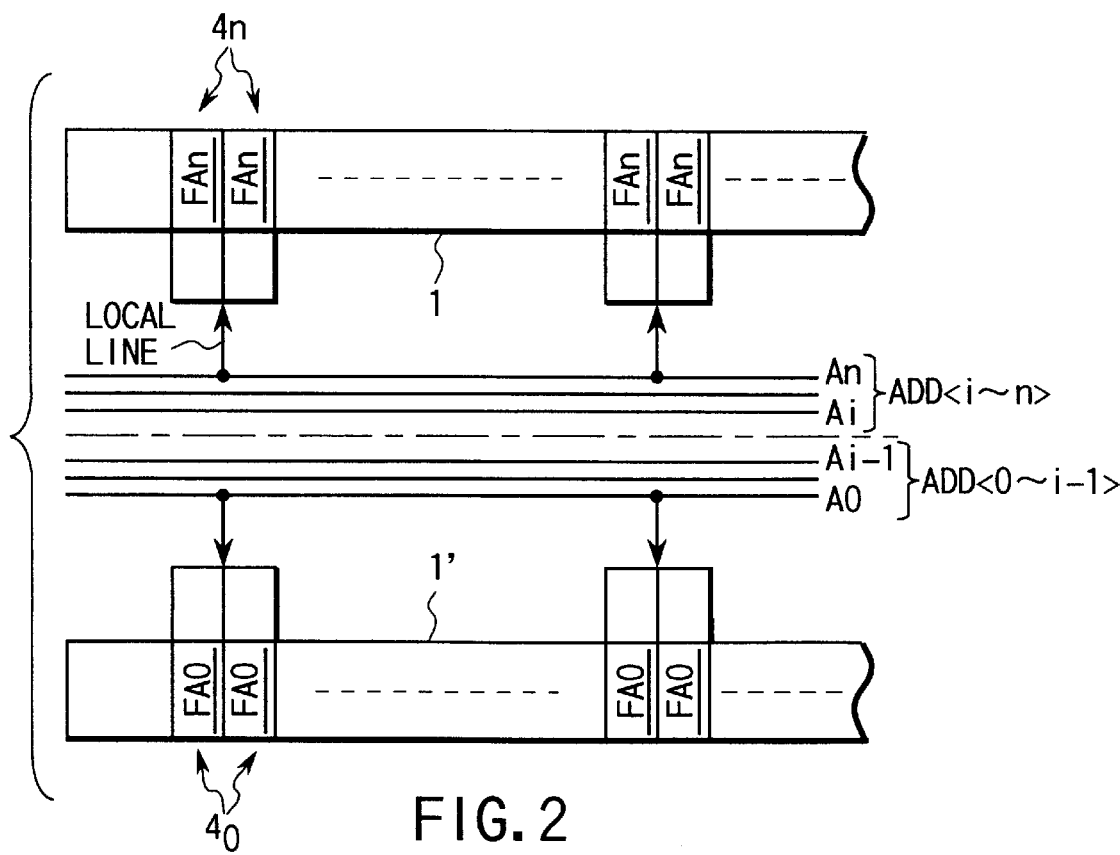
FIG. 2 is a view of a pattern of arrangement of fuse rows and address lines in a modification of the semiconductor memory device according to the first embodiment of the present invention.

FIG. 2 is a view of a pattern of arrangement of the address fuses 1 and 1' and the address lines in the modification of the semiconductor memory device, e.g. a DRAM, according to the first embodiment, which comprises the address lines constituting an address bus being connected to the fuse latch circuits (only fuse latch circuits $4_0$ and $4n$ are shown for simplicity) by the local lines. At least two address fuses associated with the same address are arranged adjacent to each other. In this modification, two address fuses FAn of the fuse latch circuit $4n$ are arranged adjacent to each other, and similarly two address fuses FA0 of the fuse latch circuit $4_0$ are arranged adjacent to each other. The other structural features of the modification are the same as those of the first embodiment. Accordingly, with respect to the modification, structural elements identical to those in the first embodiment are denoted by the same reference numerals, and explanations of those structural elements will be omitted.

In this modification, since at least two address fuses associated with the same addresses are arranged adjacent to each other, then the number of local lines required is reduced and thus the address line capacitance due to the local lines is reduced.

The second embodiment of the present invention will be explained with reference to FIGS. 3 and 4.

Figure 3:
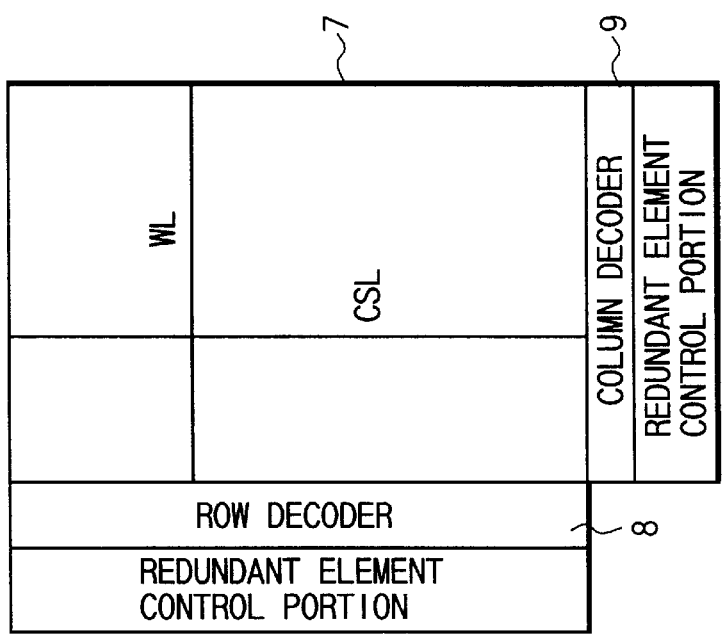
FIG. 3 is a view of a pattern of arrangement of structural components in a semiconductor memory device according to a second embodiment of the present invention.

FIG. 3 is a view for showing a pattern of arrangement of structural members included in the semiconductor memory device, e.g., a DRAM, according to the second embodiment. FIG. 4 is a view for showing a pattern of arrangement of structural elements included in a redundant element control portion of the semiconductor memory device shown in FIG. 3.

A main portion of the semiconductor memory device, as shown in FIG. 3, comprises a memory cell portion 7, a row decoder 8 and a column decoder 9. The memory cell portion 7 comprises a memory cell array in which memory cells (not shown) are arranged in a matrix, and redundant elements used in place of defective elements.

In operation, a portion of the word lines, e.g., one word line WL, is selected in accordance with an input address signal, and a portion of the bit lines, e.g., one bit line, is selected in accordance with the input address signal, so that the portion of the memory cells, i.e., one memory cell, is enabled.

The redundant element control portion of the semiconductor memory device comprises pre-decoders 10, address lines, and redundant element control circuits 6 including address fuses arranged in such a manner as shown in FIGS. 1 or 2. In the pattern, the address lines are extended through the redundant element control circuits 6. The redundant element control portion can be provided in an optional position of the semiconductor chip. As shown in FIG. 3, in this embodiment, the redundant element control portions are located on the side of the row decoder 8 and the column decoder 9.

Figure 4:
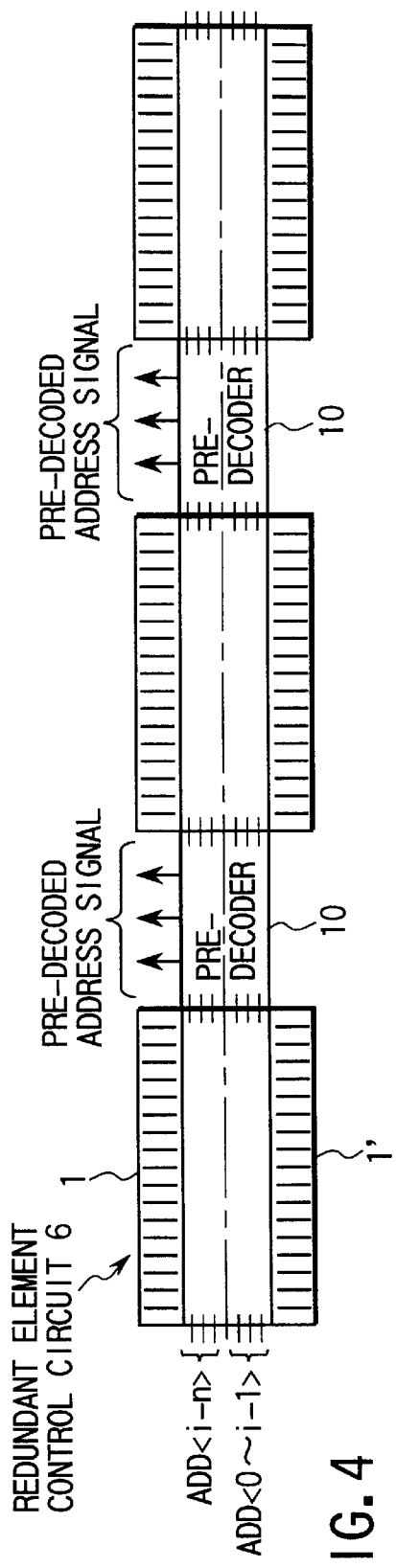
FIG. 4 is a view of a pattern of arrangement of fuse rows and pre-decoders in the semiconductor memory device shown in FIG. 3.

The fuse rows 1 and 1' of one redundant element control portion is located close to the row decoder 8 and the fuse rows 1 and 1' of another redundant element control portion is located close to the column decoder 9, and the fuse rows 1 and 1' of each of these redundant element control portions are, as shown in FIG. 4, divided into a plurality of row portions (three row portions in the second embodiment), and local lines are extended from the gap regions between the row portions.

To be more specific, when the fuse rows 1 and 1' of the redundant element control portion located close to the row decoder 8 is divided into a plurality of row portions, gap regions are provided in at least one of the fuse rows 1 and 1' which is closer to the row decoder 8. That is, the gap regions are provided in at least the fuse row 1. In the example shown in FIG. 4, the gap regions are provided in both the fuse rows 1 and 1'. The address lines associated with the address fuses of the fuse row close to the row decoder 8 can be used as address lines for the row decoder 8 and address lines for the row redundancy, since the gap regions, as explained above, are provided in at least the fuse row 1 closer to the row decoder 8 than the fuse row 1', and the local lines are extended from the gap regions.

When the fuse rows 1 and 1' of the redundant element control portion located close to the column decoder 9 is divided into a plurality of row portions, the gap regions are provided in at least one of the fuse rows 1 and 1' which is closer to the column decoder 9. That is, the gap regions are provided in at least the fuse row 1. In the example shown in FIG. 4, the gap regions are provided in both the fuse rows 1 and 1'. The address lines associated with the address fuses close to the column decoder 9 can be used as address lines for the column decoder 9, address lines for the data line sense amplifier, and address lines for the column redundancy, since the gap regions, as explained above, are provided in at least the fuse row 1 closer to the column decoder 9 than the fuse row 1', and the local lines are extended from the gap regions.

By virtue of the above structure, it is unnecessary to provide address lines specifically for only the row decoder 8 and address lines specifically for only the column decoder 9. Therefore, the area required for the address lines is reduced, and thus the total capacitance of the address buses is also reduced, as a result of which the consumption of current is decreased.

In the structure shown in FIG. 4, the local lines are not directly extended from the address lines to the row decoder 8 or the column decoder 9 through the gap regions. Thus, the input address signal is not directly transmitted to the row decoder 8 or the column decoder 9, it is pre-decoded, and then inputted to the row decoder 8 or the column decoder 9 through the local lines. To be more specific, as shown in the structure shown in FIG. 4, pre-decoders 10, which in the conventional semiconductor device are provided outside the redundant element control circuits, are provided between the redundant element control circuits 6, i.e., in the gap regions of the fuse row. The pre-decoders pre-decodes the input address signal inputted from the address lines, and then outputs it to the row decoder 8 or the column decoder 9 through the local lines. Accordingly, in the example of FIG. 4, the local lines become short, thus reducing the total parasitic capacitance of the address lines.

A third embodiment of the present invention will be explained with reference to FIGS. 5 and 6.

Figure 5:
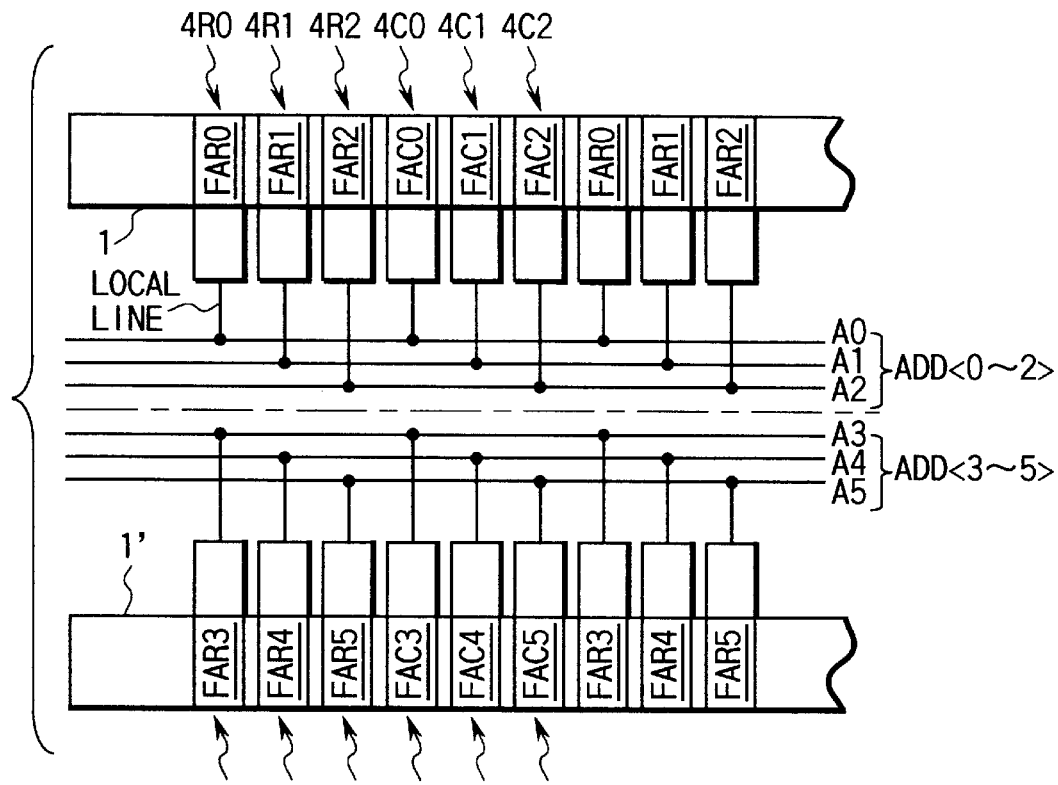
FIG. 5 is a view of a pattern of arrangement of fuse rows and address lines in a semiconductor memory device according to a third embodiment of the present invention.

FIG. 5 is a view of a pattern of arrangement of the address fuses, local lines and address lines in the semiconductor memory device such as a DRAM according to the third embodiment, the address lines constituting an address bus being connected to the fuse latch circuits by the local lines. FIG. 6 is an enlarged view of a pattern of that part of the semiconductor device of the third embodiment, which includes a redundant element control circuit 6.

According to the third embodiment, as shown in FIG. 5, address fuses associated with a row redundant element are mixed with address fuses associated with column redundant element, and each of all the address fuses is located in any one of fuse rows 1 and 1', and located close to any one of a row decoder and a column decoder. To be more specific, address fuses FAR0, FAR1 and FAR2 associated with the row redundant element are arranged in the fuse row 1 (the first stage). Address fuses FAC0, FAC1 and FAC2 associated with the column redundant element are also arranged in the fuse row 1. Thus, the address fuses FAR0, FAR1 and FAR2 of the fuse latch circuits 4R0, 4R1 and 4R2 are mixed with the address fuses FAC0, FAC1 and FAC2 of the fuse latch circuits 4C0, 4C1 and 4C2 in the fuse row 1. The address fuses AR0, AR1 and AR2 are included in associated fuse latch circuits 4R0, 4R1 and 4R2, and connected to address lines A0, A1 and A2 by local lines, respectively. Similarly, the address fuses FAC0, FAC1 and FAC2 are included in associated fuse latch circuits 4C0, 4C1 and 4C2, and connected to the address lines A0, A1 and A2 by local lines, respectively. On the other hand, address fuses FAR3, FAR4 and FAR5 associated with the row redundant element are arranged in the fuse row 1' (the second stage). Address fuses AC3, AC4 and AC5 associated with the redundancy column lines are also arranged in the fuse row 1'. Thus, the address fuses AR3, AR4 and AR5 are mixed with address fuses AC3, AC4 and AC5 in the fuse row 1'. The address fuses AR3, AR4 and AR5 are included in associated fuse latch circuits 4, and connected to address lines A3, A4 and A5 by local lines, respectively. Similarly, the address fuses FAC3, FAC4 and FAC5 are included in associated fuse latch circuits 4, and connected to the address lines A3, A4 and A5 by local lines, respectively.

In the third embodiment, at least one address fuse group including a plurality of address fuses associated with the same address is provided in one of the fuse rows 1 and 1'. Therefore, both the address fuses for row address and the address fuses for column address, which are associated with the same address, are arranged in one of the fuse rows 1 and 1'. Accordingly, an address line multiplexed by the row redundancy and the column redundancy can commonly be used. Thus, in the entire area of the semiconductor chip, the area required for the address lines is further reduced, in addition to the aforementioned advantage of the first and second embodiments wherein the address line is provided for the two fuse rows 1 and 1'. As a result, the consumption of current for driving the address lines is also reduced. This effect become more remarkable as the number of addresses increases.

Furthermore, the semiconductor memory device of the third embodiment may be modified as follows:

Gap regions are provided in at least one of the fuse rows 1 and 1' as shown in FIG. 4, and at least one of the address line for the row redundancy and the address line for the column redundancy can be also used as an address line for the row decoder 8 when said at least one address line is provided on the side of the row decoder 8, or as an address line for the column decoder 9 when said at least one address line is provided on the side of the column decoder 9. In this case also, the same advantageous effects can be obtained as in the example of FIG. 4.

Figure 6:
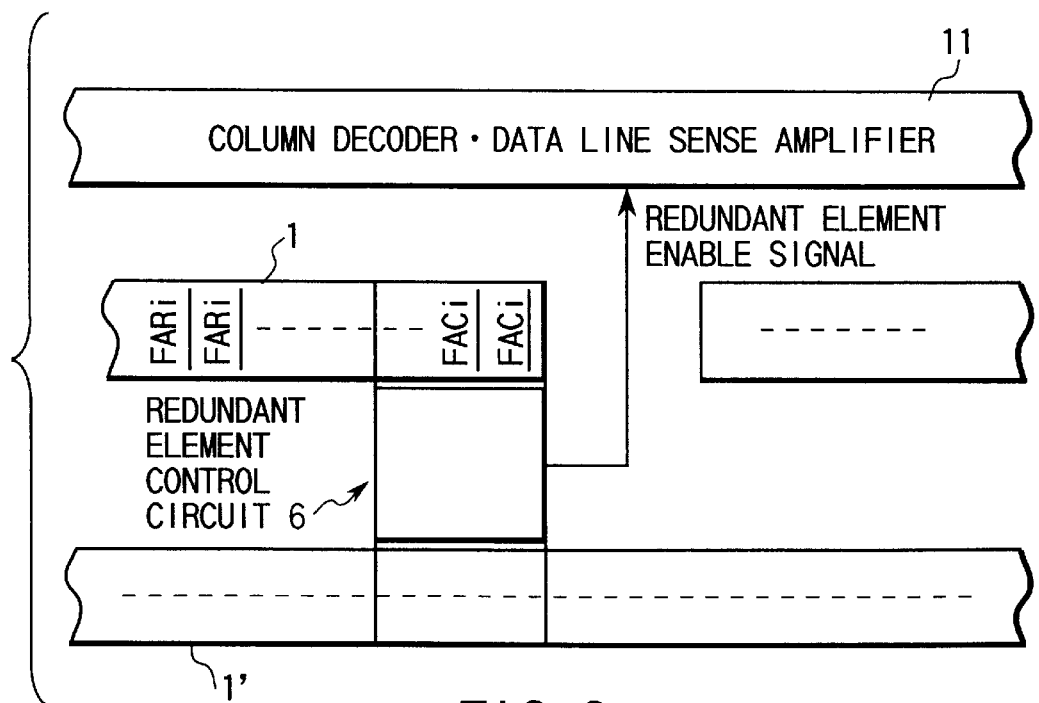
FIG. 6 is a view of a pattern of arrangement of a column decoder.data line sense amplifier, fuse rows and a redundant element control circuit in the semiconductor memory device shown in FIG. 4.
Figure 8:
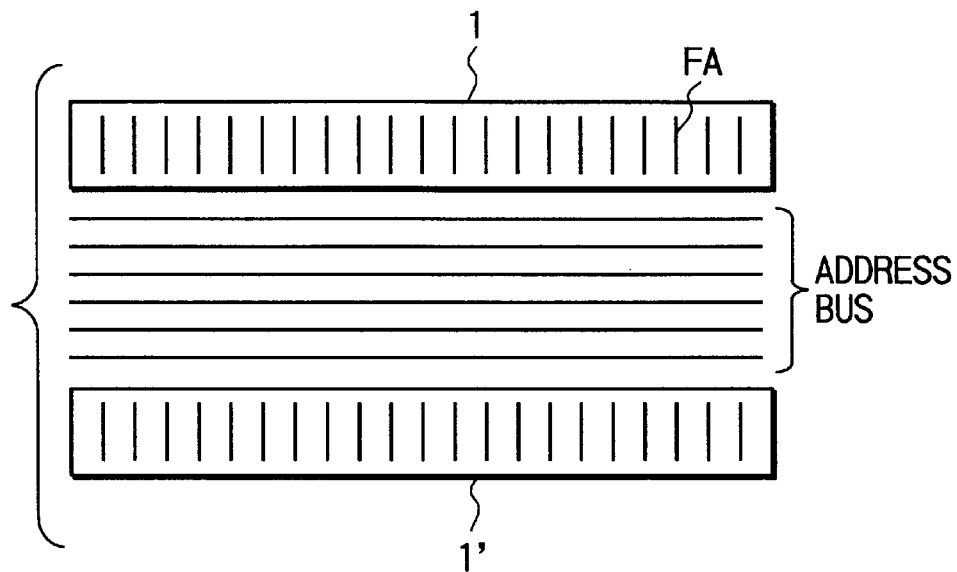
FIG. 8 is a view of a pattern of arrangement of fuse rows and address lines in a conventional semiconductor memory device.

Moreover, FIG. 6 shows a pattern of arrangement of those address fuses associated with row redundant element and column redundant element in the semiconductor memory device according to the third embodiment. The address fuses are arranged on the fuse rows 1 and 1' provided on the side of the row decoder 8 or the column decoder, and mixed with each other. FIG. 6 further shows a redundant element control circuit 6 and column decoder.data line sense amplifier. A gap region is provided in the fuse row 1.

In the example of FIG. 6, at least two of address fuses FARi for the row redundancy, associated with the same address, are arranged adjacent to each other, and at least two of address fuses FACi for the column redundancy, associated with said address, are arranged adjacent to each other.

The above adjacent address fuses FACi are closer to the gap region than the above adjacent address fuses FARi are, as shown in FIG. 6, in the case where the adjacent address fuses ARi and the adjacent address fuses ACi are arranged in one of the fuse rows, i.e., the fuse row 1 in FIG. 6, on the side of the column decoder 9.

Furthermore, the output signal (e.g., a redundant element enable signal) of the redundant element control circuit 6 is inputted to the column decoder.data line sense amplifier through a wiring provided in the gap region to control the column decoder.data line sense amplifier. The wiring can be provided at a short length, since the above adjacent address fuses ACi (for column redundant element), as explained above, are closer to the gap region than the above adjacent address fuses ARi (for row redundant element) are. Thus, the parasitic capacitance of the wiring is small, and as a result, selection of a redundant element is performed at a high speed.

On the other hand, in the case where the adjacent address fuses ARi and the adjacent address fuses ACi are arranged in one of the fuse rows on the side of the row decoder 8, the above adjacent address fuses FARi are closer to the gap region than the above adjacent address fuses FACi are. In this case, the same advantage can be obtained as in the fuse row 1 provided on the column decoder-side.

FIGS. 7A to 7E are views for showing respective patterns of arrangement of the two fuse rows 1 and 1' and address lines A0 to An, the address lines A0 to Ai-1 being associated with the fuse row 1, and the address buses Ai to An being associated with the fuse row 1'.

According to the present invention, in one of plurality of address fuse groups each include those of the address fuses, which are associated with the same address, a portion or all of said those address fuses associated with the same address are arranged on one of two of the plurality of fuse address fuse rows, which two address fuse rows are adjacent to each other and forms an address fuse row set. That is, if the address bus comprises (N+1) address lines, said at least one address line is included in (n+1)/2 of the (N+1) address lines which are closer to the address fuse row including the address fuses associated with said at least one address line than the other (n+1)/2 of the (N+1) address lines.

In the pattern of FIG. 7A, the address fuse 1 and the address fuse 1' are provided adjacent to each other as shown in the figure. In the figure, the address lines A0 to Ai-1, are located on the upper side of the fuse row 1, and the address lines Ai to An are located on the lower side of the address fuse 1'.

In the pattern of FIG. 7B, the address lines A0 to Ai-1 and the address lines Ai to An are provided adjacent to each other. The address lines A0 to Ai-1 are located on the lower side of the fuse row 1, and the address lines Ai to An are located on the upper side of the fuse row 1'.

In the pattern of FIG. 7C, the fuse rows 1 and 1' are separated from each other so that the other members of the fuse latch circuits 4 can be provided between the fuse rows 1 and 1'. The address lines A0 to Ai-1 are located on the upper side of the fuse row 1, and the address lines Ai to An are located on the lower side of the fuse row 1'.

In the pattern of FIG. 7D, the address lines A0 to Ai-1 and the address lines Ai to An are separated from each other so that the other members of the fuse latch circuits 4 are provided between the address lines A0 to Ai-1 and the address lines Ai to An. The address lines A0 to Ai-1 are located on the lower side of the fuse row 1, and the address lines are located on the upper side of the fuse row 1'.

In the pattern of FIG. 7E, the address lines A0 to Ai-1 are located on the upper side of the fuse row 1, and the address lines Ai to An are located on the upper side of the fuse row 1'. The fuse row 1 and the address lines Ai to An are separated from each other so that the other members of the fuse latch circuits 4 can be provided between the fuse row 1 and the address lines Ai to An.

In the pattern of FIG. 7F, the address lines A0 to Ai-1 are located on the lower side of the fuse row 1. The address lines Ai to An are located on the lower side of the fuse row 1'. The address lines A0 to Ai-1 and the fuse row 1' are separated from each other so that the other members of the fuse latch circuits 4 can be provided between the address lines A0 to Ai-1 and the fuse row 1'.

By virtue of the above structure, the semiconductor memory device of the present invention can restrict the parasitic capacitance of the local lines, thus reducing the total capacitance of the address lines connected to the local lines. Thus, the consumption of current for driving the address lines is small. The transit speed of the address lines becomes high. In addition, the memory device restricts an increase in the area of the semiconductor chip which would be caused by provision of address lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device comprising:

a memory cell array comprising a plurality of memory cells;

a row decoder for selecting at least one of word lines on the basis of an input address signal;

a column decoder for selecting at least one of bit lines on the basis of an input address signal;

a plurality of redundant elements each provided to be used instead of a defective element connected to said at least one of the word lines or said at least one of bit lines;

address fuses arranged in a plurality of fuse rows, said address fuses being programmed to have information for replacing the defective element by the redundant element; and an address bus comprising a plurality of address lines for transferring the input address signal;

wherein, in one of plurality of address fuse groups each include those of said address fuses, which are associated with the same address, a portion or all of said those address fuses associated with the same address are arranged on one of two of the plurality of fuse address fuse rows, which two address fuse rows are adjacent to each other and forms an address fuse row set.

2. The semiconductor memory device according to claim 1, wherein one of said address lines which is associated with said at least one address group is provided in one side of said address bus which is closer to one of said two fuse rows which includes those of said address fuses which are associated with said one address line than the other side of the address bus.

3. The semiconductor memory device according to claim 2, wherein said one of the fuse rows includes those of the address fuses which are associated with row redundant elements and those of the address fuses which are associated with column redundant elements.

4. The semiconductor memory device according to claim 3, wherein at least two of said those of the address fuses which are associated with those of the row redundant elements which are associated with the same address are arranged adjacent to each other, and at least two of said those of the address fuses which are associated with those of the column redundant elements which are associated with said same address are arranged adjacent to each other.

5. The semiconductor memory device according to claim 4, wherein said address fuses including said those address associated with said those row redundant elements and said those address associated with said those column redundant elements are located close to the column decoder, and said two adjacent address fuses associated with the redundancy column lines are located closer to said gap provided between two of the address fuses than said two adjacent address fuses associated with the redundancy row lines are.

6. The semiconductor memory device according to claim 4, wherein said address fuses including said those address associated with said those row redundant elements and said those address associated with said those column redundant elements are located close to the row decoder, and said two adjacent address fuses associated with the redundancy row lines are located closer to said gap provided between two of the address fuses than said two adjacent address fuses associated with the redundancy column lines are.

7. The semiconductor memory device according to claim 1, wherein the number of those of said address lines of said address bus, which are associated with said at least one address fuse group is less than the number of said fuse rows.

8. The semiconductor memory device according to claim 7, wherein one of said address lines which is associated with said at least one address group is provided in one side of said address bus which is closer to one of said two fuse rows which includes those of said address fuses which are associated with said one address line than the other side of the address bus.

9. The semiconductor memory device according to claim 3, wherein said one of the fuse rows includes those of the address fuses which are associated with row redundant elements and those of the address fuses which are associated with column redundant elements.

10. The semiconductor memory device according to claim 7, wherein said one of the fuse rows includes those of the address fuses which are associated with row redundant elements and those of the address fuses which are associated with column redundant elements.

11. The semiconductor memory device according to claim 1, wherein at least two address fuses of said at least one address fuse group are arranged adjacent to each other.

12. The semiconductor memory device according to claim 11, wherein said one of the fuse rows includes those of the address fuses which are associated with row redundant elements and those of the address fuses which are associated with column redundant elements.

13. The semiconductor memory device according to claim 1, wherein at least one of said address fuse rows is located close to one of said row decoder and said column decoder, and a gap for extending therethrough said address lines is provided between predetermined two of the address fuses arranged in said at least one of the address fuse rows.

14. The semiconductor memory device according to claim 13, wherein one of said address lines which is associated with said at least one address fuse group is located between said at least one of the address fuse rows and one of the address fuse rows which is adjacent to said at least one of the address fuse rows, and said one address line is used in common for the row decoder, the column decoder and a data line sense amplifier.

15. The semiconductor memory device according to claim 13, wherein said one of the fuse rows includes those of the address fuses which are associated with row redundant elements and those of the address fuses which are associated with column redundant elements.

16. The semiconductor memory device according to claims 1, wherein said one of the fuse rows includes those of the address fuses which are associated with row redundant elements and those of the address fuses which are associated with column redundant elements.

17. The semiconductor memory device according to claim 16, wherein at least two of said those of the address fuses which are associated with those of the row redundant elements which are associated with the same address are arranged adjacent to each other, and at least two of said those of the address fuses which are associated with those of the column redundant elements which are associated with said same address are arranged adjacent to each other.

18. The semiconductor memory device according to claim 17, wherein said address fuses including said those address associated with said those row redundant elements and said those address associated with said those column redundant elements are located close to the column decoder, and said two adjacent address fuses associated with the redundancy column lines are located closer to said gap provided between two of the address fuses than said two adjacent address fuses associated with the redundancy row lines are.

19. The semiconductor memory device according to claim 17, wherein said address fuses including said those address associated with said those row redundant elements and said those address associated with said those column redundant elements are located close to the row decoder, and said two adjacent address fuses associated with the redundancy row lines are located closer to said gap provided between two of the address fuses than said two adjacent address fuses associated with the redundancy column lines are.

20. A semiconductor memory device comprising:
a memory cell array comprising a plurality of memory cells;
a row decoder for selecting at least one of word lines on the basis of an input address signal;
a column decoder for selecting at least one of bit lines on the basis of an input address signal;
a plurality of redundant elements each provided to be used instead of a defective element connected to said at least one of the word line or said at least one of bit line;
address fuses arranged in two fuse rows, said address fuses being programmed to have information for replacing the defective element by the redundant element, said address fuses being grouped into a plurality of address fuse groups each includes those of said address fuses which are associated with the same address; and
an address bus comprising a plurality of address lines for transferring the input address signal;
wherein a portion or all of the address fuses of at least one of said plurality of address fuse groups is provided on one of said two address fuse rows.

* * * * *